(12) United States Patent
Tudhope et al.

(10) Patent No.: US 9,439,299 B2
(45) Date of Patent: Sep. 6, 2016

(54) LOW-PROFILE OUTDOOR LIGHTING MODULE WITH LIGHT EMITTING DIODES

(71) Applicant: Bridgelux, Inc., Livermore, CA (US)

(72) Inventors: Robert Tudhope, Pleasanton, CA (US); R. Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 310 days.

(21) Appl. No.: 14/229,903

(22) Filed: Mar. 29, 2014

(65) Prior Publication Data
US 2015/0276144 A1 Oct. 1, 2015

(51) Int. Cl.
*F21K 99/00* (2016.01)
*F21V 13/04* (2006.01)
*H05K 3/32* (2006.01)
(Continued)

(52) U.S. Cl.
CPC . *H05K 3/32* (2013.01); *F21K 9/00* (2013.01);
*F21K 9/90* (2013.01); *F21V 5/08* (2013.01);
*F21V 23/005* (2013.01); *F21V 7/05* (2013.01);
*F21V 13/04* (2013.01); *F21V 29/70* (2015.01);
*F21V 31/005* (2013.01); *F21Y 2101/02*
(2013.01); *F21Y 2105/001* (2013.01); *H05K 1/0203* (2013.01); *H05K 1/141* (2013.01);
*H05K 1/142* (2013.01); *H05K 2201/048*
(2013.01);
(Continued)

(58) Field of Classification Search
CPC .......... F21V 29/70; F21V 13/04; F21V 5/08;
F21V 23/005; F21V 31/005; F21V 7/05;
H05K 3/32; H05K 2201/048; H05K
2201/10106; H05K 1/0203; H05K 1/141;
H05K 1/142; G02B 27/00; F21K 9/00;
F21K 9/90

USPC .......... 362/267, 646, 294, 249.02, 235, 255
See application file for complete search history.

(56) References Cited

U.S. PATENT DOCUMENTS 7,255,460 B2 * 8/2007 Lee ........................... F21V 9/08
362/231
8,172,434 B1 * 5/2012 Olsson .................... B63B 45/00
362/241

(Continued)

OTHER PUBLICATIONS

Image of ProLight Opto Driver on Board from ProLight Opto Technology Corporation downloaded from Internet on Oct. 24, 2013 from site http://www.led-professional.com/products/led-modules-led-light-engines/prolight-opto-launches-new-driver-on-board-dob-series.

(Continued)

*Primary Examiner* — Anh Mai
*Assistant Examiner* — Arman B Fallahkhair
(74) *Attorney, Agent, or Firm* — Imperium Patent Works; Darien K. Wallace

(57) ABSTRACT

A low-profile lighting module with light-emitting diodes (LEDs) has a water-tight seal between a molded-plastic cover and a printed circuit board (PCB). A substrate with the LEDs fits up into an indentation in the lower surface of the PCB. Landing pads on the top of the substrate attach to contact pads in the indentation that are extensions of a conductor of the PCB which is electrically coupled through the landing pads to the LEDs. A lens with a curved optical portion surrounded by a flat lip fits into another indentation on the upper surface of the PCB. A highly reflective sheet is disposed between the planar lower surface of the lens and bottom of the indentation in the upper surface. A double-sided adhesive sheet is disposed under the inside surface of the molded-plastic cover and over both the upper surface of the PCB and the flat lip of the lens.

20 Claims, 9 Drawing Sheets

(51) Int. Cl.
*F21V 23/00* (2015.01)
*F21V 5/08* (2006.01)
*F21V 29/70* (2015.01)
*F21V 31/00* (2006.01)
*F21Y 101/02* (2006.01)
*F21V 7/05* (2006.01)
*F21Y 105/00* (2016.01)
*H05K 1/02* (2006.01)
*H05K 1/14* (2006.01)

(52) U.S. Cl.
CPC ...... *H05K 2201/10106* (2013.01); *Y02B 20/72* (2013.01); *Y10T 29/4913* (2015.01)

(56) References Cited

U.S. PATENT DOCUMENTS

| | | | |
|---|---|---|---|
| 8,274,644 B2 | 9/2012 | Nisper et al. | 356/45 |
| 8,371,717 B2 | 2/2013 | Lai | 362/276 |
| 8,672,517 B2* | 3/2014 | Chung | F21V 29/20 257/100 |
| 8,907,550 B2* | 12/2014 | Zaderej | F21K 9/00 313/46 |
| 2006/0012897 A1* | 1/2006 | Reid | F21V 7/0008 359/857 |
| 2006/0108594 A1* | 5/2006 | Iwasaki | H01L 33/58 257/98 |
| 2011/0199203 A1 | 8/2011 | Hsu | 340/449 |
| 2012/0032612 A1 | 2/2012 | Antony et al. | 315/297 |
| 2012/0062150 A1 | 3/2012 | West | 315/309 |
| 2012/0256548 A1 | 10/2012 | Collins et al. | 315/151 |
| 2013/0084748 A1 | 4/2013 | Zaderej et al. | 439/620.02 |
| 2013/0176732 A1 | 7/2013 | McGowan et al. | 362/249.02 |
| 2014/0063814 A1* | 3/2014 | McGowan | F21V 7/00 362/308 |

OTHER PUBLICATIONS

Datasheet for Molex part 180414-0102, Molex Incorporated, downloaded from Internet on Oct. 24, 2013 from http://www.molex.com/webdocs/datasheets/pdf/en-us/1804140102_SOLID_STATE_LIGHTI.pdf.

* cited by examiner

LOW-PROFILE OUTDOOR LIGHTING MODULE WITH LIGHT EMITTING DIODES

TECHNICAL FIELD

The present invention relates generally to packaging for light-emitting diodes, and more particularly, to a low-profile, water-tight package for light emitting diodes.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. In order to use an LED die, the die is typically enclosed along with other LED dies in a package. In one example, the packaged device is referred to as an LED array. The LED array includes an array of LED dies mounted onto a heat conducting substrate. A layer of silicone in which phosphor particles is embedded is typically disposed over the LED dies. Electrical contact pads are provided for supplying current into the LED array and through the LED dies so that the LED dies can be made to emit light. Light emitted from the LED dies is absorbed by the phosphor particles, and is re-emitted by the phosphor particles so that the re-emitted light has a wider band of wavelengths. Making a light fixture or lighting module out of an LED array, however, typically involves other components. The LED array generates heat when used. The performance and operational lifetime of the LED dies is degraded if the operating temperature exceeds a threshold level. Empirical data demonstrates that there is an inverse relationship between the useful life of an LED die and the amount by which the average operating temperature exceeds a threshold level, such as 25 degrees Celsius. Thus, dissipating the heat generated by the LED array in a lighting module is a problem that must be solved.

In order to remove enough heat from the LED array so as to keep the LED array adequately cool, the LED array is typically fixed in some way to a heat sink. In addition, power must somehow be supplied to the LED array. Power supply circuitry is typically required to supply current to the LED array in a desired and suitable fashion. Optical components are also generally employed to direct and focus the emitted light in a desired fashion. There are many considerations involved in packaging an LED array so that the array can be used effectively in the lighting module. A low cost method of packaging LED arrays in a weatherized lighting module is sought.

SUMMARY

A low-profile, outdoor lighting module with light-emitting diodes (LED) dies is easily manufactured. A water-tight seal is formed between a molded-plastic cover and a printed circuit board (PCB). The LED dies are disposed on a top surface of a substrate that fits up into an indentation in the lower surface of the PCB. The lower surface of the PCB and the bottom surface of the substrate are substantially coplanar. Landing pads on the top surface of the substrate attach to contact pads in the indentation that are coupled to a conductor of the PCB such that the conductor is electrically coupled through the landing pads to the LED dies. A lens fits into another indentation on the upper surface of the PCB. The lens has a curved optical portion surrounded by a flat lip. A highly reflective sheet is disposed between the planar lower surface of the lens and bottom of the indentation in the upper surface. The highly reflective sheet is made of flame resistant paper. A hole in the highly reflective sheet is disposed over the LED dies. A double-sided adhesive sheet is disposed under the inside surface of the molded-plastic cover and over both the upper surface of the PCB and the flat lip of the lens.

The molded-plastic cover forms a component compartment that houses electronic components, such as drive electronics for the LED dies. The drive electronics are disposed between the upper surface of the PCB and the inside surface of the cover. The drive electronics supply a regulated constant current to the LED dies. The drive electronics receive a higher voltage that is input into the lighting module and supply a lower voltage to the LED dies. In one embodiment, the low-profile lighting module includes a buck converter.

The lighting module can be mounted to a heat sink, such as a street light, the canopy of a gas station or the metal siding of a building. A thermal interface material can be applied to the bottom surface of the substrate so that the upper surface of the heat sink contacts the thermal interface material. If the thermal interface material is broadly dispensed over the bottom of the lighting module, the lower surface of the PCB also contacts the thermal interface material.

A method for manufacturing the low-profile lighting module uses a double-sided adhesive sheet to make a water-tight seal over the top of the PCB. First, light emitting diode (LED) dies are mounted on a substrate with landing pads on its top surface. The landing pads are then attached to contact pads on a conductor disposed on an underside of a lip of the printed circuit board. The lip is located around the periphery of a hole in the middle of a lower indentation in the lower surface of the PCB. After the landing pads are attached to the conductor, the lower surface of the PCB and the bottom surface of the substrate are substantially coplanar. Drive electronics are mounted to the upper surface of the PCB and are disposed between the upper surface of the PCB and the inside surface of a molded-plastic cover that is applied in a later step. The drive electronics are electrically coupled to the LED dies through the landing pads.

Next, a highly reflective sheet is placed in the bottom of an upper indentation in the upper surface of the PCB. The highly reflective sheet has a hole that is disposed over the LED dies. A lens is then placed in the upper indentation over the highly reflective sheet. The lens has a curved optical portion, a flat lip and a planar lower surface. The reflective sheet is pressed between the lower surface of the lens and the bottom of the upper indentation. The inside surface of the molded-plastic cover is attached to both the upper surface of the PCB and the flat lip of the lens using the double-sided adhesive sheet. The double-sided adhesive sheet is a means for instantly forming a water-tight seal between the lens and the PCB and for affixing the inside surface of the molded-plastic cover both to the upper surface of the PCB and to the lip of the lens.

A thermal interface material is applied to the upper surface of a heat sink. The substrate and the PCB are placed over the thermal interface material such that the thermal interface material contacts both the bottom surface of the substrate and the lower surface of the PCB.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
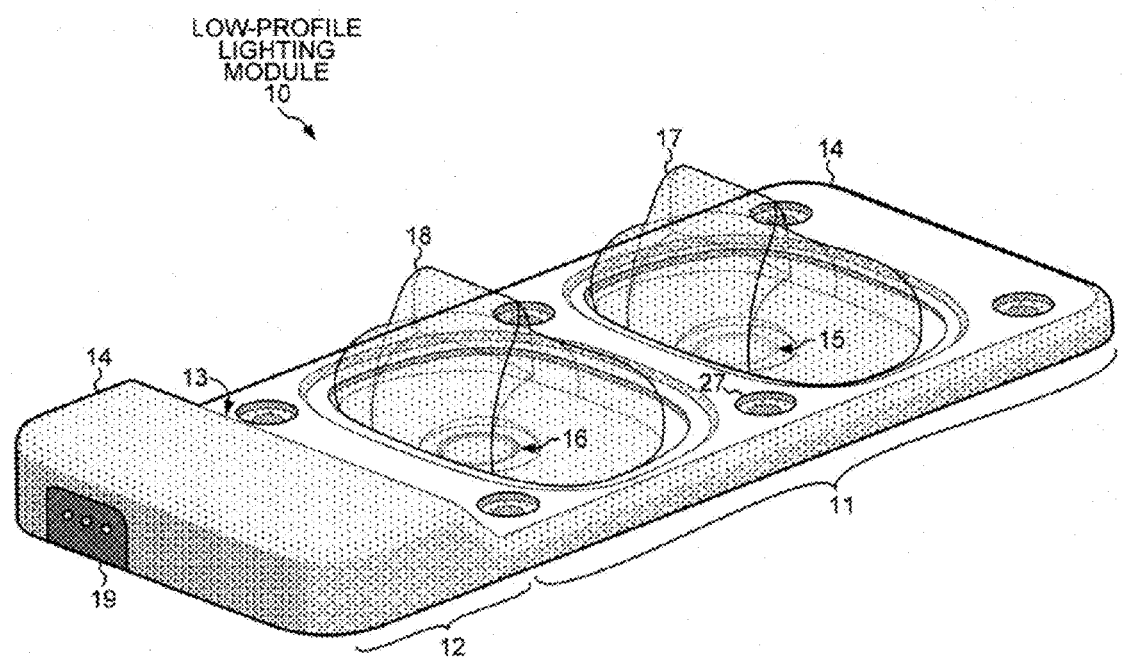
FIG. 1 is a perspective view of a low-profile, outdoor lighting module with light-emitting diodes.

FIG. 1 shows a low-profile lighting module 10 with light-emitting diodes (LEDs). In one configuration, module 10 provides lighting with about forty Watts of power and is suitable for use in street lights, under the canopies of gas stations, on the metal siding of buildings and in bay lights in warehouses and big box stores. Module 10 has limited space requirements because of its low profile. In one configuration, the flat body 11 of module 10 is less than seven millimeters thick, and the component compartment 12 is less than fifteen millimeters thick. Component compartment 12 has a slanted surface 13 towards the flat body 11. Because module 10 is so thin, it fits in most street lights in the space that would otherwise be occupied by conventional high-pressure sodium (HPS) bulbs. For example, module 10 with a power of about forty Watts can be used to retrofit a 70-Watt high-pressure sodium street lamp. Module 10 is water tight and is suitable for outdoor use. No solder or screws are used to attach the molded-plastic cover 14 to the printed circuit board on which the components are mounted. The six holes in module 10 are used to screw or bolt the module to a street lamp, metal siding or other heat sink.

Module 10 includes two LED arrays 15-16. In one configuration, the LED arrays 15-16 consume a combined power of about forty Watts and emit about 4200 lumens of light. An optical lens 17-18 is disposed over each LED array 15-16. Lenses 17-18 are shaped to disburse the light emitted from LED arrays 15-16 in an asymmetric pattern, such as in a rectangular illumination area. A grommet 19 forms a water-tight seal around three electrical cords that supply power to module 10. Grommet 19 fits into a slot in the side of the component compartment 12.

Figure 2:
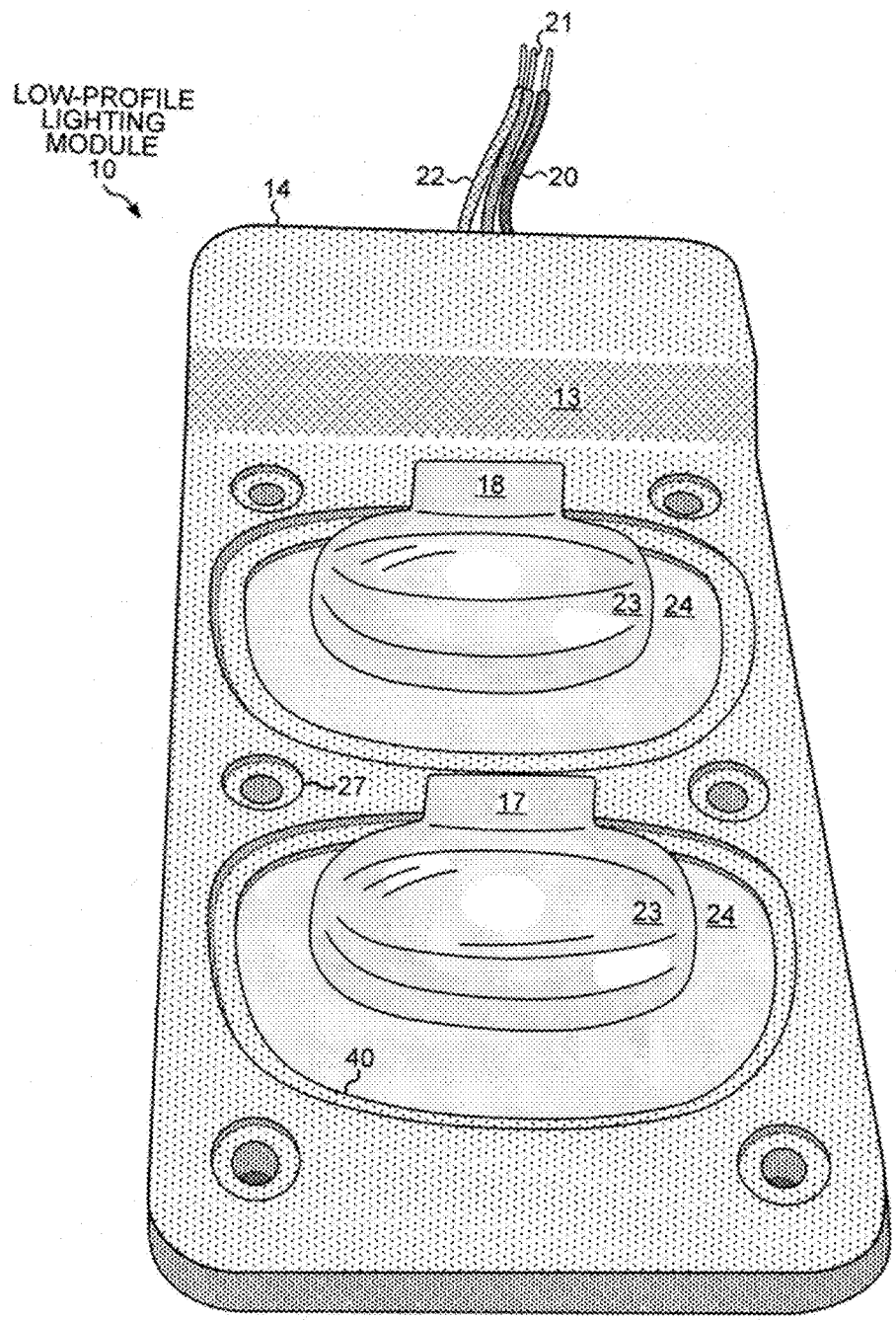
FIG. 2 is a front perspective view of the low-profile lighting module of FIG. 1.

FIG. 2 is a different perspective view of low-profile lighting module 10 of FIG. 1. FIG. 2 shows the three electrical cords 20-22 that enter module 10 through grommet 19 at the top. FIG. 2 also shows that each of the lenses 17-18 has a curved optical portion 23 and a flat lip 24. The edge of each flat lip 24 fits under the lip of an opening in cover 14. In the description and claims, terms such as "upper", "lower", "top", "bottom", "up", and "down are used to describe relative orientations between different parts of the module, and it is to be understood that the overall structure being described can actually be oriented in any way in three-dimensional space. When a first object is referred to as being disposed "over" or "on" a second object, it is to be understood that the first object can be directly on the second object, or an intervening object may be present between the first and second objects.

Figure 3A:
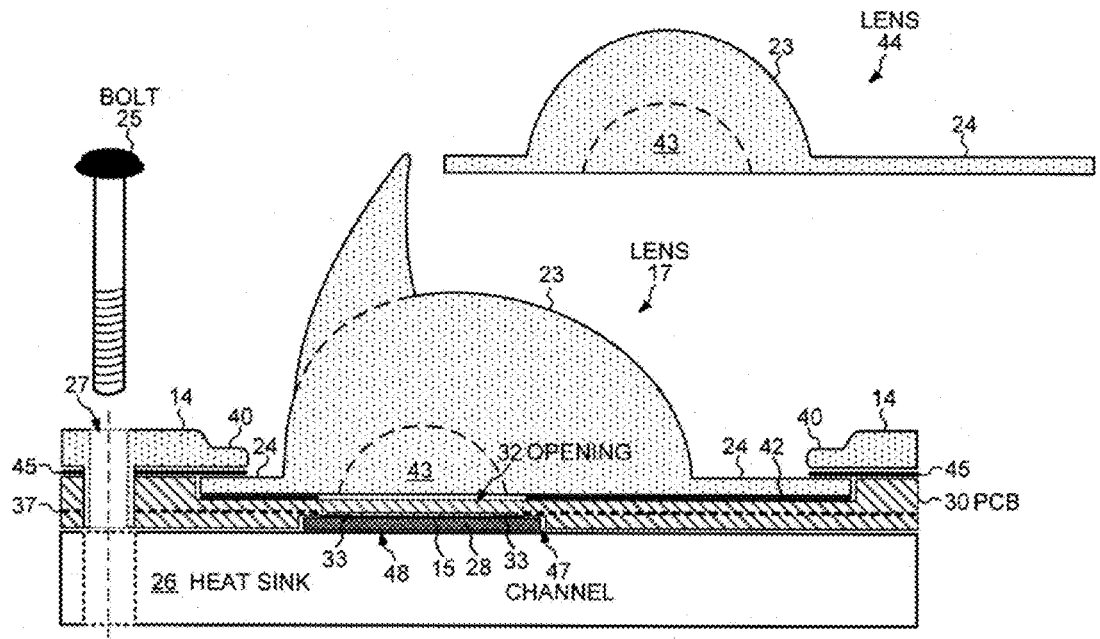
FIG. 3A is a longitudinal cross-sectional view through a lens of the lighting module of FIG. 1.

FIG. 3A is a longitudinal cross-sectional view of a portion of module 10 through lens 17. FIG. 3A shows a bolt 25 used to attach module 10 to a heat sink 26. Bolt 25 passes through one of the six holes 27 in the molded-plastic cover 14. FIG. 3A illustrates how a substrate 28 on which LED array 15 is mounted fits up into a lower indentation 29 in a multi-layer printed circuit board (PCB) 30 that forms the base of module 10. A plurality of electronic components, including drive electronics, are mounted onto PCB 30 under component compartment 12 of cover 14 outside the view of FIG. 3A. Molded-plastic cover 14 may, for example, be made from the flame retardant, 30%-glass fiber reinforced polybutylene terephthalate (PBT) thermoplastic polymer PBT-RG301 from Kingfa Sci. & Tech. Co., LTD., in Guangzhou, China 510520.

Figure 3B:
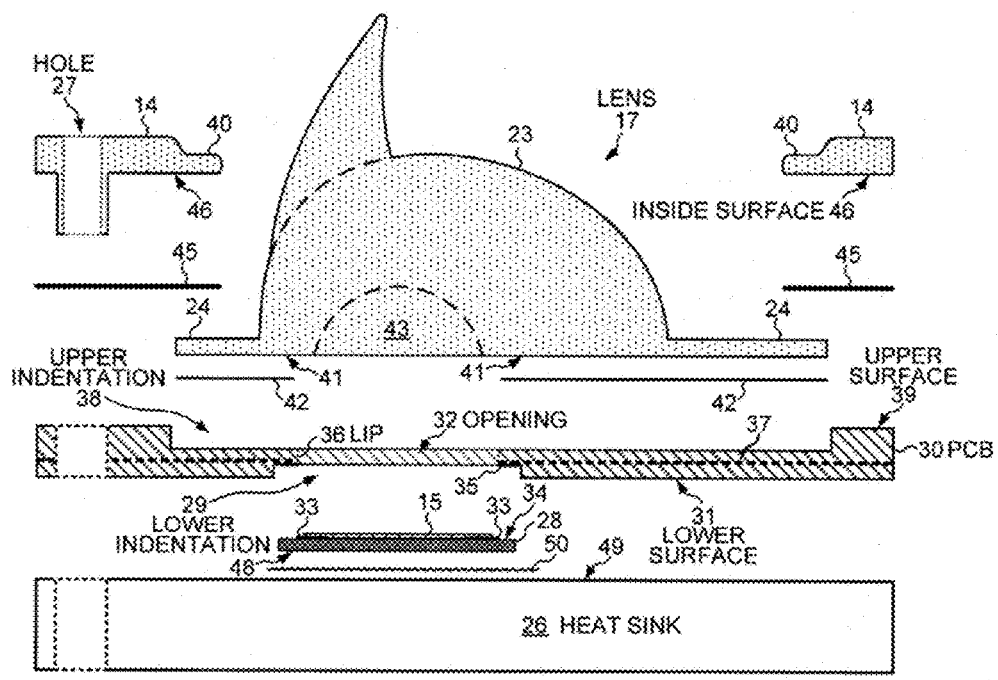
FIG. 3B is an exploded view of the elements of the lighting module shown in FIG. 3A.

The elements of FIG. 3A are shown in an exploded view in FIG. 3B for clearer labeling. FIG. 3B shows that lower indentation 29 is located in the lower surface 31 of PCB 30. Lower indentation 29 has a square shape with a centered circular opening 32 through PCB 30. Landing pads 33 are located on the top surface 34 of substrate 28. Each of the landing pads 33 on the top surface 34 of substrate 28 is soldered to a corresponding contact pad 35 on the downward facing inside lip 36 of opening 32. Solder paste is placed on the landing pads 33 before substrate 28 is moved up into lower indentation 29, and then the assembly is heated in a reflow soldering process to solder the landing pads 33 to the contact pads 35. Other soldering and mechanical/electrical interface methods such as conductive adhesives could be used instead of reflow soldering with solder paste. Substrate 28 is mechanically connected to PCB 30 only through the bonds between landing pads 33 and contact pads 35.

Although PCB 30 is described herein as a conventional FR-4 PCB, other structures such as a Kapton "flex circuit" or a metal clad PCB can also be used. PCB 30 includes various metal layers, such as conductor 37, between fiberglass layers. Conductor 37 is electrically coupled to the contact pads 35. The drive electronics are electrically coupled to each LED die of LED array 15 through the landing pads 33. Drive current is provided to each LED die from the drive electronics and through conductor 37, the contact pads 35, the reflowed solder, and the landing pads 33.

PCB 30 also has an upper indentation 38 located in the upper surface 39 of PCB 30. Lens 17 fits into upper indentation 38 and is held in place by cover 14. FIG. 3A shows the curved optical portion 23 and the flat lip 24 of lens 17. The peripheral edge of the flat lip 24 is pressed down into upper indentation 38 by the lip 40 of the opening in cover 14. Lens 17 has a planar lower surface 41 that presses a highly reflective sheet 42 to the bottom of upper indentation 38. Highly reflective sheet 42 is cut to have the shape of upper indentation 38. There is no need to glue sheet 42 to lower surface 41 or to the bottom of upper indentation 38. Highly reflective sheet 42 may, for example, be the white-coated flame barrier FRB-WT145 available from 3M in Austin, Tex. 78726. The white-coating provides a 90% reflectivity to sheet 42. When highly reflective sheet 42 is disposed between lower surface 41 of lens 17 and upper indentation 38, a hole in sheet 42 is located over LED array 15. Light emitted from LED array 15 passes through opening 32, through the hole in sheet 42 and into a hollow dome 43 in lower surface 41 of lens 17.

In one embodiment, the dome 43 is filled with an index-matching gel or silicone in order to reduce the reflection from the inside surface of the dome. Where the LED dies of LED array 15 are gallium nitride (GaN) diodes, for example, the dome 43 is filled with a silicone that has an index of refraction between the 2.4 refractive index of GaN and the 1.42 refractive index of the methyl-based silicone used to make lens 17, such as polydimethylsiloxane (PDMS). For example, a phenyl-based silicone with a refractive index of 1.54 can be used to fill the dome 43. The sum of the internal reflection from multiple interfaces across media with smaller stepwise differences in their refractive indices is less than the total reflection from fewer interfaces having the same total difference in the index of refraction between the first medium and the last medium.

FIG. 3A also shows an alternate lens 44 that can be built into low-profile lighting module 10. Lens 44 has a smaller curved optical portion 23 and a larger flat lip 24. Module 10 is designed to accommodate multiple lens shapes by giving the periphery of the flat lip 24 a uniform size and shape that fits into upper indentation 38 regardless of the size of the curved optical portion 23. Lens 44 generates a symmetrical oval optical pattern of emitted light instead of the rectangular optical pattern produced by lens 17. By using different lenses above the two LED arrays 15-16, the optical patterns can be made to overlap to achieve a brighter coverage. Alternatively, lenses can be chosen that do not produce overlapping optical patterns and thereby provide a larger coverage area. For example, lenses 17-18 generate long, mostly non-overlapping rectangular optical patterns that are appropriate to provide lighting along a street.

The molded-plastic cover 14 is attached to the upper surface 39 of PCB 30 by a double-sided adhesive sheet 45. Adhesive sheet 45 may, for example, be the VHB™ acrylic foam tape RP25 available from 3M of St. Paul, Minn. 55144. Adhesive sheet 45 attaches the inside surface 46 of cover 14 to both upper surface 39 of PCB 30 and to flat lip 24 of lens 17. Because adhesive sheet 45 covers both upper surface 39 of PCB 30 and lip 24 of lens 17, a water-tight seal is created over the groove between lens 17 and PCB 30. Thus, moisture is prevented from entering module 10 from the light emitting side. Moisture is also prevented from entering module 10 through the lower indentation 29 in PCB 30 by forming a room-temperature vulcanizing (RTV) rubber seal in the channel 47 between substrate 28 and the walls of lower indentation 29. The rubber is dispensed into channel 47 after substrate 28 has been attached inside lower indentation 29 using a solder reflow process. Grommet 19 forms a water-tight seal around electrical cords 20-22 and between the cords and cover 14. Thus, module 10 is weatherized and can withstand harsh outdoor usage, such as being bolted to the aluminum siding of a building without being protected under a canopy or roof.

When substrate 28 is mounted up into lower indentation 29, the bottom surface 48 of substrate 28 is substantially coplanar with lower surface 31 of PCB 30. In this manner, the bottom side of module 10 can be mounted to the planar surface 49 of heat sink 26 to achieve a good thermal contact. To improve the thermal coupling between module 10 and heat sink 26, a thermal interface material 50 can optionally be used. In this case, substrate 28 is thermally coupled through the thermal interface material 50 to heat sink 26. Thermal interface material 50 is placed on upper surface 49 of heat sink 26, and lower surface 31 of PCB 30 contacts thermal interface material 50. In one implementation, thermal interface material 50 is thermal grease, and module 10 is attached to heat sink 26 by bolts 25. In another implementation, thermal interface material 50 is thermal glue which adheres lower surface 31 of PCB 30 to upper surface 49 of heat sink 26. No bolts are required when thermal glue is used. Any small deviations of surfaces 31 and 49 from being exactly planar are compensated by the thickness of the thermal interface material.

Figure 4:
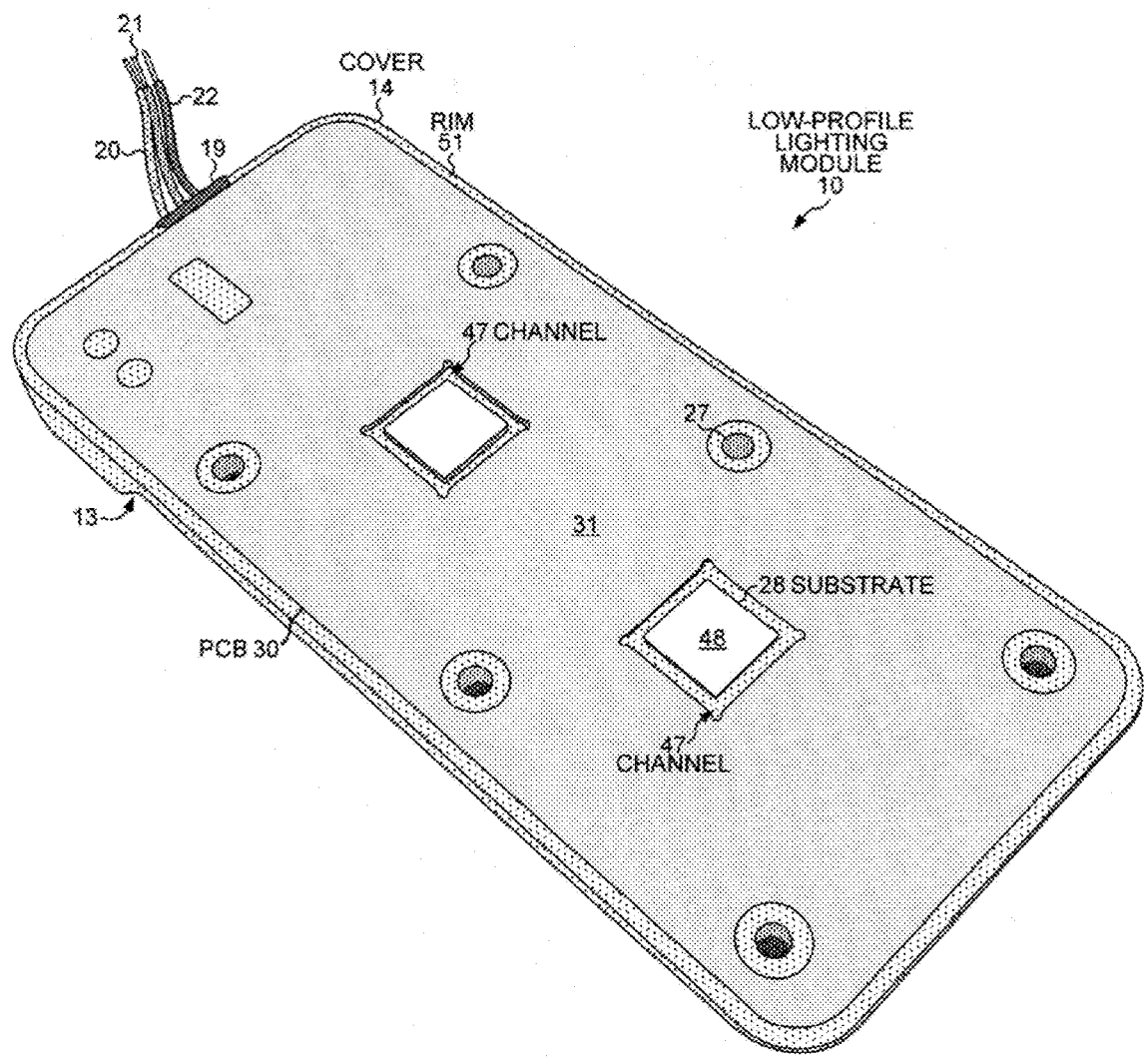
FIG. 4 is a perspective view of the bottom of the lighting module of FIG. 1.

FIG. 4 shows the bottom side of low-profile lighting module 10 that is attached to heat sink 26. FIG. 4 shows the RTV rubber seal in channel 47 between substrate 28 and the walls of lower indentation 29. Although the bottom rim 51 of molded-plastic cover 14 is not sealed to the sides of PCB 30, moisture cannot enter between upper surface 39 of PCB 30 and inside surface 46 of cover 14 due to the seal formed by double-sided adhesive sheet 45. Similarly, moisture is prevented from reaching upper surface 39 of PCB 30 from round the plastic surrounding the six holes 27 by the seal formed by adhesive sheet 45.

Figure 5:
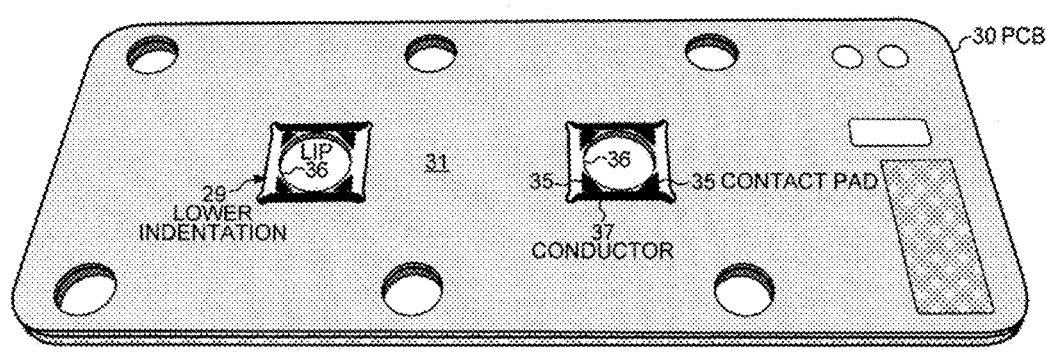
FIG. 5 shows the circuit board that forms the back of the lighting module of FIG. 1 before a substrate with an LED array has been inserted into an indentation in the circuit board.

FIG. 5 shows lower surface 31 of PCB 30 before substrate 28 is inserted up into lower indentation 29 and the landing pads 33 are attached to the contact pads 35 using a solder reflow process. The contact pads 35 are extensions of the conductive layer 37 of PCB 30 that are disposed on the underside of lip 36 between opening 32 and the walls of lower indentation 29. Both the contact pads 35 and the landing pads 33 have the same general triangular shapes to provide alignment during the solder reflow step.

Figure 6:
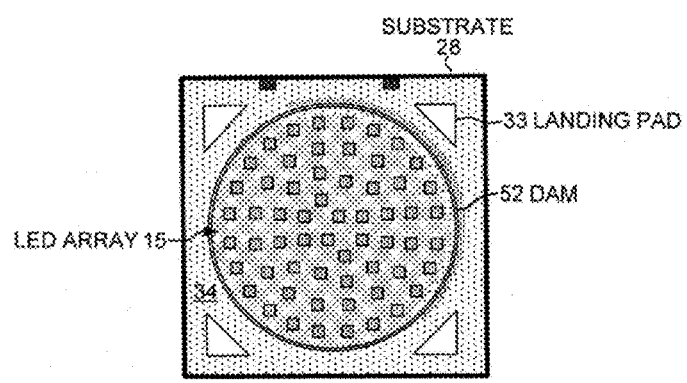
FIG. 6 shows a substrate on which LED dies of an LED array are mounted.

FIG. 6 shows substrate 28 on which the LED dies of LED array 15 are mounted. Substrate 28 is aluminum and includes various layers of dielectric and metal to form contacts and isolations. In some embodiments, the LED dies are electrically connected to power and driver circuitry through conductive layers at the top of substrate 28 with bond wires connecting to tap points on the conductive layers. In other embodiments, however, the LED dies are electrically connected to power through bond wires that connect to the landing pads 33. A silicone layer containing phosphor particles covers the LED dies. Silicone or another transparent carrier material is poured into a dam 52 and hardens forming a conformal covering over the LED dies.

Figure 7:
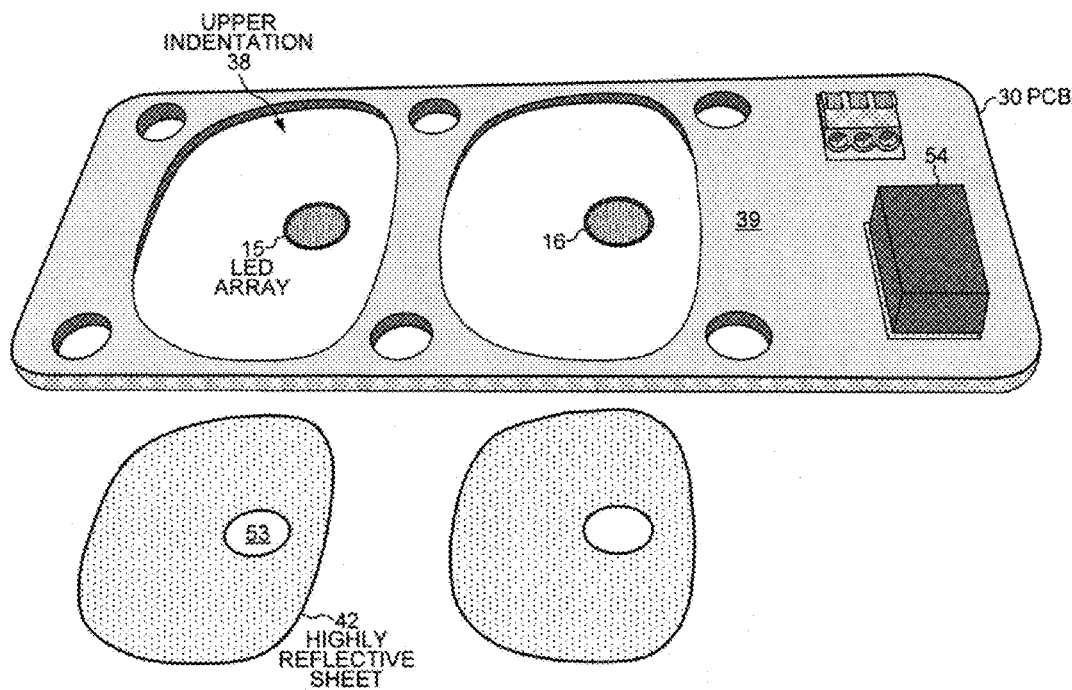
FIG. 7 shows the circuit board of FIG. 5 after the substrate with the LED array has been attached inside an indentation in the board.

FIG. 7 shows PCB 30 after substrate 28 has been attached inside lower indentation 29 and before the cutout of highly reflective sheet 42 has been placed in the bottom of upper indentation 38. Highly reflective sheet 42 reflects light out of module 10 that is emitted from LED array 15 and then reflected back down at an interface of lens 17. FIG. 7 shows the hole 53 in sheet 42 that is located over LED array 15 after sheet 42 is placed in indentation 38. Sheet 42 is simply placed in indentation 38 without an adhesive and is held in place by the lower surface 41 of lens 17. Another method of achieving a highly reflective surface on the bottom of upper indentation 38 is to apply a layer of titanium oxide ($TiO_2$). The titanium oxide layer is about 94% reflective, whereas sheet 42 is about 90% reflective. Highly reflective sheet 42 is preferable to a layer of titanium oxide, however, because the process of baking on the titanium oxide warps PCB 30. Sheet 42 is also less expensive than the process of applying titanium oxide. FIG. 7 also shows a structure 54 that contains drive electronics and other electronic components that power and control the LED arrays 15-16.

Figure 8:
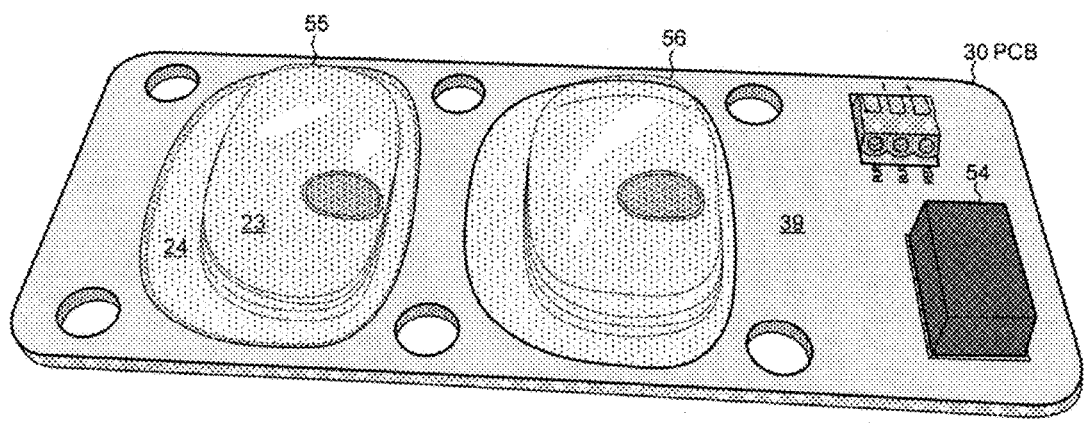
FIG. 8 shows the circuit board of FIG. 7 after optical lenses have been placed into indentations in the board.

FIG. 8 shows PCB 30 after lenses 55-56 have been placed into the upper indentations. The curved optical portions 23 of lenses 55-56 are shaped differently than the optical portions of both lens 17 and lens 44. However, the periphery of the flat lip 24 has the same shape in all of the lenses. The uniform size and shape of the lip portion of the various lenses allows low-profile lighting modules with different lens designs to be manufactured using the same assembly process.

Figures 9, 11:
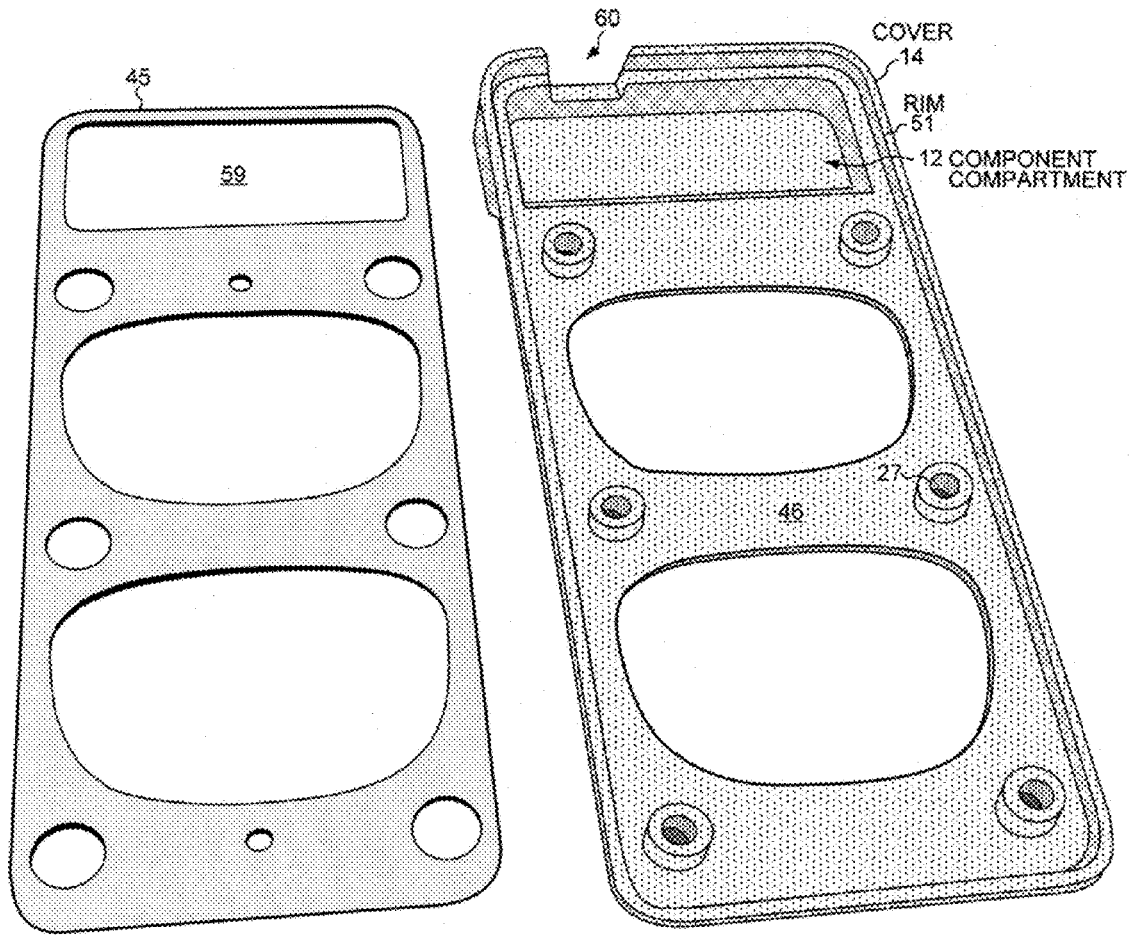
FIG. 9 shows a double-sided adhesive sheet before the sheet is stuck to the inside surface of the molded-plastic cover shown in FIG. 11.
FIG. 11 shows the inside of the molded-plastic cover of the lighting module of FIG. 1.
Figure 10:
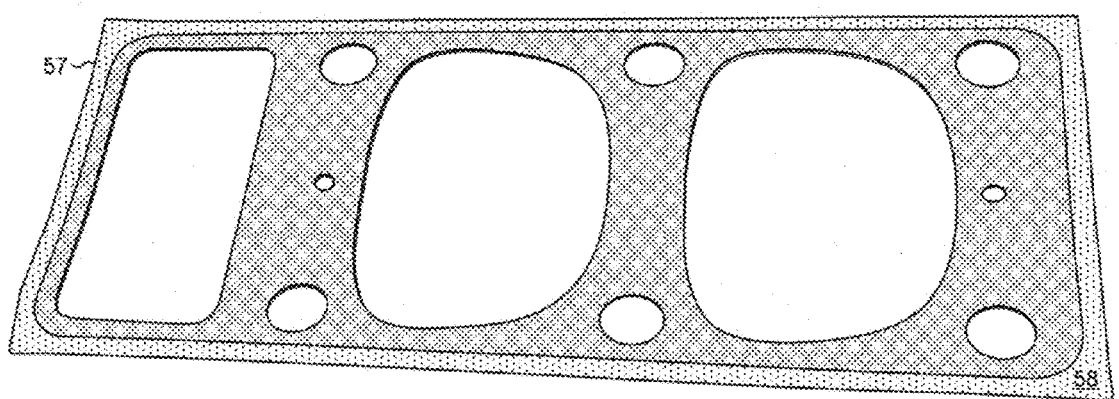
FIG. 10 shows the template from which the adhesive sheet of FIG. 9 was stripped.

FIG. 9 shows double-sided adhesive sheet 45 before the sheet is stuck to the inside surface 46 of cover 14. Adhesive sheet 45 in FIG. 9 has been removed from the template 57 shown in FIG. 10. The non-sticky liner 58 is removed from the back side of adhesive sheet 45 after the sticky front side has been placed on the inside surface 46 of cover 14. Then the sticky back side of sheet 45 is placed down over the upper surface 39 of PCB 30 and over the periphery of the lips 24 of the lenses. Adhesive sheet 45 has a cutout 59 that fits over the components on PCB 30 in component compartment 12. FIG. 9 shows the slot 60 in the side of the component compartment 12 into which grommet 19 slides forming a water-tight seal around the electrical cords to module 10.

Figure 12:
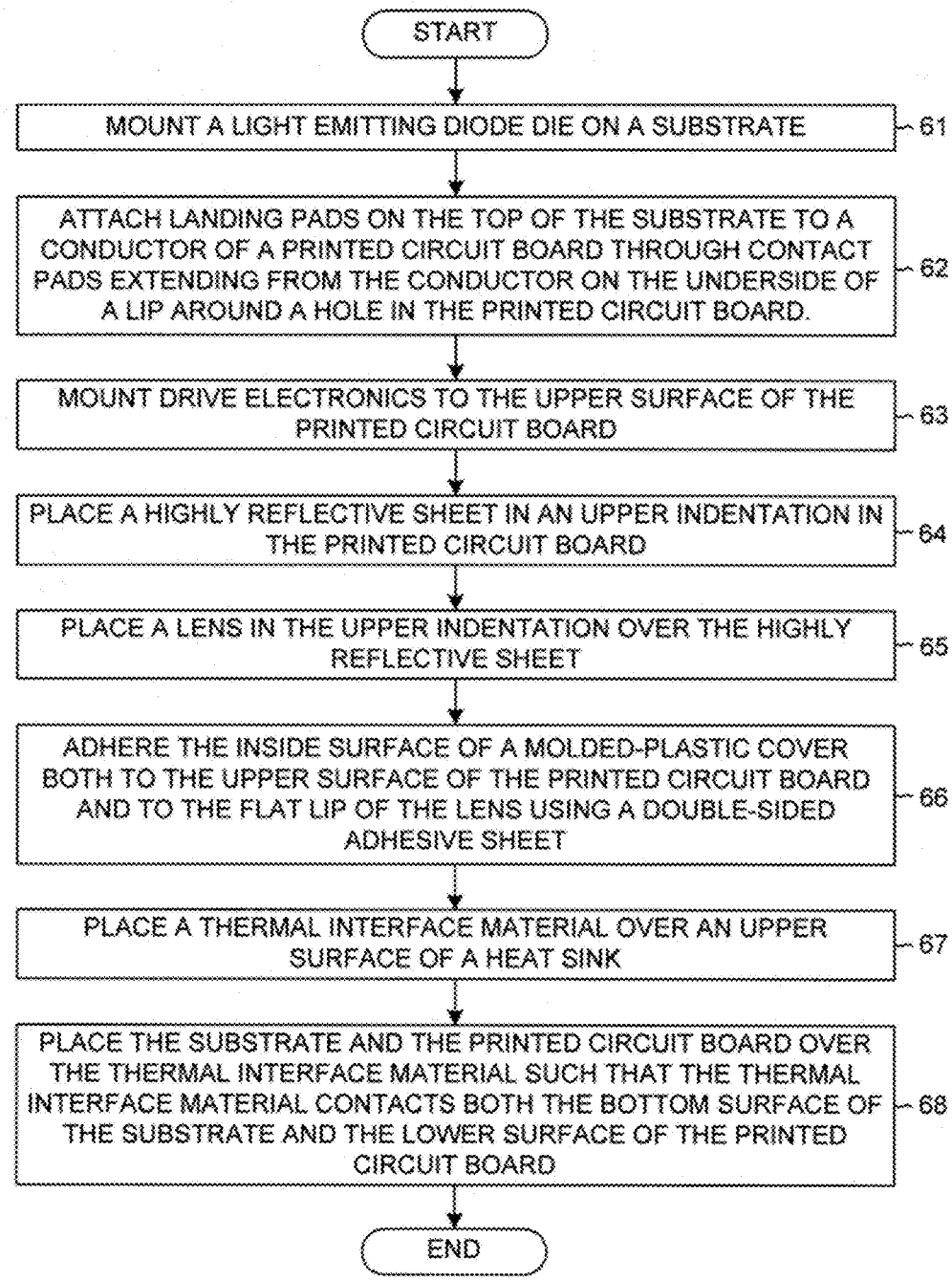
FIG. 12 is a flowchart of steps for making the low-profile, outdoor lighting module of FIG. 1.

FIG. 12 is a flowchart illustrating steps 61-68 of a method of making the low-profile, outdoor lighting module 10. In a first step 61, LED dies are mounted on substrate 28 to form LED array 15. In step 62, landing pads 35 on the top surface 34 of substrate 28 are attached to conductor 37 through contact pads 35 on the underside of lip 36 of PCB 30. The landing pads 35 are triangular extensions of the conductive layer 37 of PCB 30. When the landing pads 35 on substrate 28 are attached to the contact pads 35 on PCB 30, the lower surface 31 of PCB 30 and the bottom surface 48 of substrate 28 are substantially coplanar.

In step 63, drive electronics are mounted to upper surface 39 of PCB 30. The drive electronics are mounted at a location on PCB 30 such that they will be inside component compartment 12 after molded-plastic cover 14 is attached to PCB 30 in step 66. After cover 14 is attached, the drive electronics are disposed between upper surface 39 of PCB 30 and inside surface 46 of cover 14. In step 64, highly reflective sheet 42 is placed in upper indentation 38 such that hole 53 in sheet 42 is located over LED array 15. In step 65, lens 17 is placed in upper indentation 38 over highly reflective sheet 42. The planar lower surface 41 of lens 17 presses sheet 42 to the bottom of upper indentation 38. And in step 66, the inside surface 46 of molded-plastic cover 14 is attached both to upper surface 39 of PCB 30 and to the edge of flat lip 24 of lens 17 using double-sided adhesive sheet 45.

In step 67, thermal interface material 50 is placed over upper surface 49 of heat sink 26. Then in step 68, substrate 28 and PCB 30 are placed over thermal interface material 50 such that the thermal interface material contacts both bottom surface 48 of substrate 28 and lower surface 31 of PCB 30. Alternatively, thermal interface material 50 can be deposited only under substrate 28, in which case bottom surface 48 of substrate 28 is coupled to heat sink 26 through thermal interface material 50, and lower surface 31 of PCB 30 directly contacts heat sink 26. Low-profile lighting module 10 is then attached to heat sink 26 using bolts 25 that pass through the six holes 27 in cover 14.

Various electronic components can be housed in component compartment 12 in order to impart intelligence to lighting module 10 and to create an "integrated smart module (ISM)". For example, the electronic components of low-profile lighting module 10 include a microcontroller integrated circuit, a voltage and current measuring interface circuit, a communication integrated circuit, and a switching DC-to-DC converter.

Figure 13:
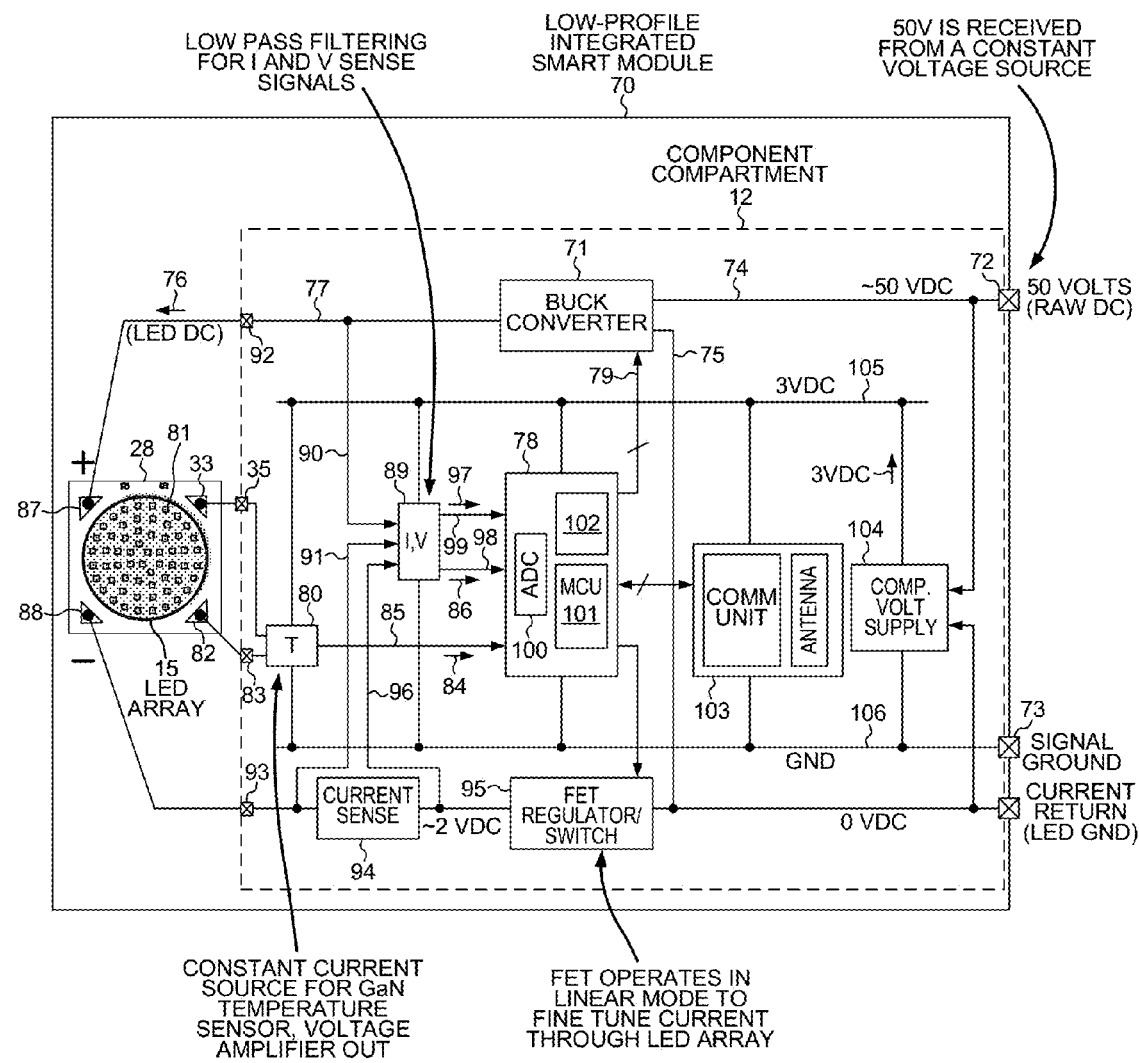
FIG. 13 is a circuit diagram of a low-profile, outdoor integrated smart module with a buck converter.

FIG. 13 is a circuit diagram of a low-profile, outdoor integrated smart module 70 with a switching DC-to-DC converter 71. Integrated smart module 70 is constructed in the same manner as low-profile lighting module 10. Converter 71 is a buck converter that receives an unconditioned constant DC voltage of about fifty volts and outputs a regulated constant current between 27-32 volts to LED array 15. The 50-volt supply voltage across pins 72 and 73 is received onto buck converter 71 between conductor 74 and conductor 75. From this 50-volt supply voltage, for example, buck converter 71 outputs the LED drive current 76 at about twenty-seven volts to LED array 15 via conductor 77. Microcontroller 78 adjusts the frequency and/or duty cycle at which current is switched through the inductor of buck converter 71 by sending multi-bit digital control information to the oscillator of converter 71 across conductors 79. By adjusting the frequency and/or duty cycle, microcontroller 78 controls the magnitude of the nominal output current 76 that buck converter 71 supplies on conductor 77 to the LED dies of LED array 15.

Microcontroller 78 monitors the temperature of LED array 15 via a temperature interface circuit 80. Temperature interface circuit 80 includes a constant current source that supplies a constant current to a temperature sensing GaN die 81 via contact pad 35, landing pad 33, landing pad 82 and contact pad 83. The temperature interface circuit 80 also includes a voltage amplifier that amplifies the sensed voltage across landing pads 33 and 82 and supplies the resulting amplified voltage signal 84 to the microcontroller 78 via conductor 85. In addition, microcontroller 78 monitors the voltage 86 with which the LED dies of LED array 15 are driven. This LED drive voltage is the voltage between landing pads 87 and 88. A current and voltage measuring interface circuit 89 measures this voltage via conductors 90 and 91. In addition, microcontroller 78 monitors the LED drive current 76 flowing through the LED dies. This current 76 flows from pin 72, through contact pad 92, through landing pad 87, through the LED dies, through landing pad 88, through contact pad 93, through current sense resistor 94, through FET switch 95 and out of the low-profile integrated smart module 10 via pin 73. The current and voltage measuring interface circuit 89 detects the LED drive current 76 as the voltage dropped across the current sense resistor 94. This voltage is detected across conductors 91 and 96. The voltage and current measuring interface circuit 89 receives the voltage sense and current sense signals, low pass filters them, amplifies them, and performs level shifting and scaling to generate a voltage sense signal 86 and a current sense signal 97. The voltage and current sense signals 86 and 97 are supplied to the microcontroller 78 via conductors 98 and 99, respectively.

The temperature sense signal 84, the voltage sense signal 86, and the current sense signal 97 are converted into digital values by an analog-to-digital converter (ADC) 100 of the microcontroller 78. A main control unit (MCU) 101 of the microcontroller 78 executes a program 102 of processor-executable instructions. The current, voltage and temperature sense signals, as well as information received from a communication integrated circuit 103, are used by the MCU 101 to determine how to control FET switch 95. In the present example, the MCU 101 can control the FET switch to be nonconductive, thereby turning off the LED dies. The MCU 101 can control the FET switch to be fully conductive, thereby turning on the LED dies to a brightness proportional to the current supplied by buck converter 71. The microcontroller 78 controls the FET switch 95 to be fully on with nearly zero voltage across it when the LED dies are being illuminated.

The circuit components 80, 89, 78 and 103 are powered from a low DC supply voltage such as 3 volts DC. A component voltage supply circuit 104 generates this 3-volt supply voltage from the fifty volts across pins 72 and 73. The 3-volt supply voltage is supplied onto voltage supply conductor 105. Conductor 106 is the ground reference conductor for the component supply voltage. Because only a small amount of power is required to power the circuitry embedded in the integrated smart module 10, the component voltage supply circuit 104 may be a simple linear voltage regulator.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
a light emitting diode (LED) die;
a substrate with a top surface and a bottom surface, wherein the LED die is disposed on the top surface of the substrate;
a landing pad disposed on the top surface of the substrate;
a printed circuit board having a contact pad, a lower surface, a lower indentation in the lower surface, an upper surface, and an upper indentation in the upper surface, wherein the contact pad is disposed in the lower indentation, wherein the substrate fits into the lower indentation such that the contact pad is electrically coupled through the landing pad to the LED die, and wherein the lower surface of the printed circuit board and the bottom surface of the substrate are substantially coplanar;
a highly reflective sheet;
a lens with a planar lower surface and a lip, wherein the lens fits into the upper indentation, and wherein the highly reflective sheet is disposed between the lower surface of the lens and the upper indentation;
a double-sided adhesive sheet; and
a cover of molded plastic with an inside surface, wherein the adhesive sheet is disposed under the inside surface of the cover and over both the upper surface of the printed circuit board and the lip of the lens.

2. The device of claim 1, further comprising:
a heat sink with an upper surface; and
a thermal interface material, wherein the bottom surface of the substrate contacts the thermal interface material, and wherein the upper surface of the heat sink contacts the thermal interface material.

3. The device of claim 2, wherein the lower surface of the printed circuit board contacts the thermal interface material.

4. The device of claim 1, further comprising:
drive electronics disposed between the upper surface of the printed circuit board and the inside surface of the cover.

5. The device of claim 4, wherein the drive electronics receive a higher voltage and supply a lower voltage to the LED die.

6. The device of claim 4, wherein the drive electronics supply a regulated constant current to the LED die.

7. The device of claim 1, wherein the highly reflective sheet has a hole that is disposed over the LED die.

8. The device of claim 1, wherein the highly reflective sheet is flame resistant paper.

9. The device of claim 1, wherein the lens has a hollow dome disposed over the LED die.

10. A method comprising:
mounting a light emitting diode (LED) die on a substrate, wherein the substrate has a top surface and a bottom surface, wherein a landing pad is disposed on the top surface of the substrate;
attaching the landing pad to a contact pad disposed on an underside of a lip of a printed circuit board, wherein the printed circuit board has a lower surface, a lower indentation in the lower surface, an upper surface, and an upper indentation in the upper surface, wherein the lip is disposed around a periphery of the lower indentation, and wherein the lower surface of the printed circuit board and the bottom surface of the substrate are substantially coplanar after the landing pad is attached;
placing a highly reflective sheet in the upper indentation;
placing a lens in the upper indentation over the highly reflective sheet, wherein the lens has a curved optical portion and a flat lip; and
attaching an inside surface of a molded-plastic cover both to the upper surface of the printed circuit board and to the flat lip of the lens using a double-sided adhesive sheet.

11. The method of claim 10, wherein the lens has a planar lower surface, and wherein the reflective sheet contacts the planar lower surface and is pressed between the planar lower surface of the lens and the upper indentation.

12. The method of claim 10, further comprising:
placing a thermal interface material over an upper surface of a heat sink; and
placing the substrate and the printed circuit board over the thermal interface material such that the thermal interface material contacts both the bottom surface of the substrate and the lower surface of the printed circuit board.

13. The method of claim 10, wherein the highly reflective sheet has a hole that is disposed over the LED die.

14. The method of claim 10, wherein the highly reflective sheet is flame resistant paper.

15. The method of claim 10, further comprising:
coupling the bottom surface of the substrate to a heat sink through a thermal interface material, wherein the lower surface of the printed circuit board contacts the heat sink.

16. The method of claim 10, further comprising:
mounting drive electronics to the upper surface of the printed circuit board, wherein the drive electronics are disposed between the upper surface of the printed circuit board and the inside surface of the molded-plastic cover.

17. The method of claim 10, wherein the drive electronics are electrically coupled to the LED die through the landing pad.

18. A device comprising:
a light emitting diode (LED) die;
a substrate with a top surface and a bottom surface, wherein the LED die and a landing pad are disposed on the top surface of the substrate;
a printed circuit board having a lower surface, a lower indentation in the lower surface, an upper surface, and an upper indentation in the upper surface, wherein a contact pad is disposed in the lower indentation, wherein the substrate fits into the lower indentation such that the landing pad contacts the contact pad and such that the lower surface of the printed circuit board and the bottom surface of the substrate are substantially coplanar;
a lens with a lower surface and a lip, wherein the lower surface of the lens is disposed in the upper indentation; and
means for forming a water-tight seal between the lens and the printed circuit board and for affixing an inside surface of a molded-plastic cover both to the upper surface of the printed circuit board and to the lip of the lens.

19. The device of claim 18, wherein the means instantly forms the water-tight seal between the lens and the printed circuit board.

20. The device of claim 18, wherein the means is a sheet.

* * * * *